US010681814B2

(12) United States Patent
Bultitude et al.

(10) Patent No.: US 10,681,814 B2
(45) Date of Patent: Jun. 9, 2020

(54) HIGH DENSITY MULTI-COMPONENT PACKAGES

(71) Applicant: KEMET Electronics Corporation, Simpsonville, SC (US)

(72) Inventors: John Bultitude, Simpsonville, SC (US); Galen W. Miller, Simpsonville, SC (US); John McConnell, Simpsonville, SC (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 0 days.

(21) Appl. No.: 15/699,654

(22) Filed: Sep. 8, 2017

(65) Prior Publication Data

US 2019/0082539 A1    Mar. 14, 2019

(51) Int. Cl.
*H05K 1/18* (2006.01)
*H05K 3/30* (2006.01)
(Continued)

(52) U.S. Cl.
CPC ......... *H05K 1/18* (2013.01); *H01L 23/49827* (2013.01); *H01L 23/49838* (2013.01); *H05K 3/301* (2013.01); *H05K 3/3436* (2013.01); *H05K 2201/1003* (2013.01); *H05K 2201/10015* (2013.01); *H05K 2201/10022* (2013.01); *H05K 2201/1031* (2013.01); *H05K 2201/10053* (2013.01); *H05K 2201/1053* (2013.01); *H05K 2201/10151* (2013.01); *H05K 2201/10174* (2013.01); *H05K 2201/10181* (2013.01); *H05K 2201/10196* (2013.01); *H05K 2201/10378* (2013.01); *H05K 2201/10484* (2013.01);

(Continued)

(58) Field of Classification Search
CPC .... H05K 1/18; H05K 3/301; H01L 23/49827; H01L 23/49838
See application file for complete search history.

(56) References Cited

U.S. PATENT DOCUMENTS 6,376,769 B1 *  4/2002  Chung ............... B32B 3/08
                                                174/260
8,018,731 B2 *  9/2011  Sakurai ............. H01L 23/13
                                                361/728

(Continued)

FOREIGN PATENT DOCUMENTS

JP    2016/162939    9/2016

OTHER PUBLICATIONS

ISA/US; International Search Report and Written Opinion prepared for PCT/US2018/050142; dated Nov. 7, 2018.

*Primary Examiner* — Nathan Milakovich
(74) *Attorney, Agent, or Firm* — Joseph T. Guy; Patent Filing Specialist, Inc.

(57) ABSTRACT

Provided is a high density multi-component package and a method of manufacturing a high density multi-component package. The high density multi-component package comprises at least two electronic components wherein each electronic component of the electronic components comprise a first external termination and a second external termination. At least one interposer is between the adjacent electronic components and attached to the interposer by an interconnect wherein the interposer is selected from an active interposer and a mechanical interposer. Adjacent electronic components are connected serially.

60 Claims, 15 Drawing Sheets

(51) Int. Cl.
   *H01L 23/498*     (2006.01)
   *H05K 3/34*       (2006.01)

(52) U.S. Cl.
   CPC .............. *H05K 2201/10515* (2013.01); *H05K 2201/10659* (2013.01); *H05K 2201/10946* (2013.01); *H05K 2201/10962* (2013.01)

(56) References Cited

U.S. PATENT DOCUMENTS

| | | | | |
|---|---|---|---|---|
| 8,264,816 | B2* | 9/2012 | Bultitude | H01G 2/16 |
| | | | | 361/321.4 |
| 9,171,672 | B2* | 10/2015 | McConnell | H01G 4/38 |
| 9,472,342 | B2 | 10/2016 | McConnell et al. | |
| 2006/0220230 | A1* | 10/2006 | Tanaka | H01L 23/481 |
| | | | | 257/723 |
| 2012/0309121 | A1 | 12/2012 | Yoneda et al. | |
| 2013/0016488 | A1 | 1/2013 | McConnell et al. | |
| 2013/0187292 | A1* | 7/2013 | Semmelmeyer | H01L 25/0652 |
| | | | | 257/777 |
| 2013/0284501 | A1* | 10/2013 | McConnell | H05K 1/0271 |
| | | | | 174/255 |
| 2014/0002952 | A1* | 1/2014 | McConnell | B23K 1/0016 |
| | | | | 361/301.4 |
| 2015/0113195 | A1* | 4/2015 | Kim | G06F 13/4027 |
| | | | | 710/308 |
| 2016/0071818 | A1* | 3/2016 | Wang | H01L 25/0655 |
| | | | | 257/774 |
| 2016/0205769 | A1* | 7/2016 | Park | H01G 4/224 |
| | | | | 174/260 |
| 2016/0366765 | A1* | 12/2016 | Martinez | H05K 1/0295 |
| 2017/0025223 | A1 | 1/2017 | Bultitude et al. | |
| 2017/0103852 | A1* | 4/2017 | Ando | H01G 4/002 |
| 2017/0256521 | A1* | 9/2017 | Cok | H01L 25/165 |
| 2017/0358397 | A1 | 12/2017 | McConnell et al. | |
| 2018/0042110 | A1* | 2/2018 | Cok | H05K 1/18 |
| 2018/0102469 | A1* | 4/2018 | Das | H01L 23/49888 |
| 2018/0247915 | A1* | 8/2018 | Kinsley | H01L 25/0657 |
| 2019/0080982 | A1* | 3/2019 | Bultitude | H01L 23/40 |

* cited by examiner

HIGH DENSITY MULTI-COMPONENT PACKAGES

FIELD OF THE INVENTION

The present invention is related to a high-density package of electronic components, and method of making the package, wherein increased functionality can be achieved in a limited footprint. More specifically, the present invention is specific to a high-density package comprising interposers which allow serial connectivity of a variety of electronic components.

BACKGROUND

There is an on-going need in electronics to provide increased functionality in increasingly smaller devices. This desire, referred to as miniaturization, has dominated research efforts associated with components, mounting techniques and the like. While most of the effort has been focused on decreasing the footprint of electronic components on a circuit board more recent efforts have focused on stacking components thereby occupying the space above and below the board instead of occupying surface area of the board.

Stacked multi-layer ceramic capacitors (MLCC) are described in commonly assigned U.S. Pat. No. 9,472,342, to McConnell et al., which is incorporated herein by reference, wherein leadless multi-layer ceramic capacitors are formed in stacks where two or more MLCC's are bonded together by their terminations using transient liquid phase sintering (TLPS) adhesives. The resulting stack can be surface mounted by techniques known in the art such as soldering since the TLPS does not reflow at the soldering temperature.

While advantageous, the leadless stacks provide capacitors in electrical parallel only and therefore the applications are somewhat limited. There are many applications requiring electronic components serially connected. Serially connected components can be achieved by bonding the terminals of the respective components end-to-end, rather than in a stack, however this increases the space required for mounting which is contrary to the overwhelming desire for miniaturization.

There is an ongoing necessity for a package comprising multiple components, which can be serially connected, while minimizing the footprint of the package on the circuit board. Provided herein is an improved package for multiple components, preferably including at least one MLCC, wherein at least some of the electronic components in the package are serially connected.

SUMMARY OF THE INVENTION

The present invention is related to high density multi-component packages.

More specifically, the present invention is related to high density multi-component packages which allow for serial or parallel connectivity of different components.

A particular feature of the invention is the ability to mount a high density package on a circuit board either vertically or horizontally.

These and other embodiments, as will be realized, are provided in a high density multi-component package and a method of manufacturing a high density multi-component package. The high density multi-component package comprises at least two electronic components wherein each electronic component of the electronic components comprise a first external termination and a second external termination. At least one interposer is between the adjacent electronic components and attached to the interposer by an interconnect wherein the interposer is selected from an active interposer and a mechanical interposer. Adjacent electronic components are connected serially.

Yet another embodiment is provided in an electronic circuit. The electronic circuit comprises a high density multi-component package comprising at least two electronic components wherein each electronic component comprises a first external termination and a second external termination. An interposer is between adjacent electronic components wherein the interposer is selected from an active interposer and a mechanical interposer. The adjacent electronic components are connected serially. A circuit board is provided wherein the circuit board comprises traces wherein at least one trace is an active trace and at least one trace is a mechanical trace. At least one first external termination of a first electronic component is in electrical contact with one active trace and at least one second external termination of a second electronic component is in electrical contact with a mechanical trace.

Yet another embodiment is provided in a method for forming a high density multi-component package comprising:
providing at least two electronic components wherein each electronic component comprises a first external termination and a second external termination;
forming a stack of electronic components with at least one interposer between adjacent electronic components wherein the interposer is selected from an active interposer and a mechanical interposer; and
attaching the first external terminations to first traces on the interposer and the second external terminations to second traces on the interposer with an interconnect wherein adjacent electronic components are connected serially.

Yet another embodiment is provided in a method for forming an electronic circuit comprising:
forming a high density multi-component package by:
providing at least two electronic components wherein each electronic component comprises a first external termination and a second external termination;
forming a stack of electronic components with at least one interposer between adjacent electronic components wherein the interposer is selected from an active interposer and a mechanical interposer; and
attaching the first external terminations to first traces on the interposer and second external terminations to second traces on the interposer with an interconnect wherein adjacent electronic components are connected serially;
providing a circuit board comprising traces wherein at least one trace is an active trace and at least one trace is a mechanical trace;
attaching at least one first external termination of a first electronic component to one active trace with an interconnect; and
attaching at least one second external termination of a second electronic component to a mechanical trace with the interconnect.

DESCRIPTION

The present invention is related to a high density multi-component package of electronic components wherein at least some of the electronic components are serially connected and the package minimizes surface area required on the circuit board. More specifically, the present invention is related to a stack of electronic components comprising interposers there between.

The high density multi-component package of the present invention comprises an interposer between adjacent electronic components thereby providing for a serial configuration. The interposer provides for a connection between one terminal of each adjacent component within the stack of electronic components. In one embodiment, the package of electronic components can be surface mounted with the end terminals of the outermost components electrically connected to the circuit. The high density multi-component package can be used to form high density packages containing mixed electronic components and provides the flexibility to connect the electronic component in electrical series as well as in electrical parallel thereby enabling high density packages of multifunctional components with a variety of electronic configurations.

To form the serial connection between adjacent electronic components the interposers in an embodiment have an electrical connection through the interposer as either a via through-hole or a conductive wrap around the substrate of the interposer as will be described. Solder pads are preferably provided on the via or wrap to form a mechanical and electrical bond to the external termination of the electronic component. These conductive pads can be formed using any conductive metal. Copper and aluminum are common in the case of organic interposers but for inorganic interposers any thick or thin conductive metals can be used. These may also be protected by over-plating.

The invention will be described with reference to the figures forming an integral, non-limiting, component of the disclosure. Throughout the various figures similar elements will be numbered accordingly.

Figure 1:
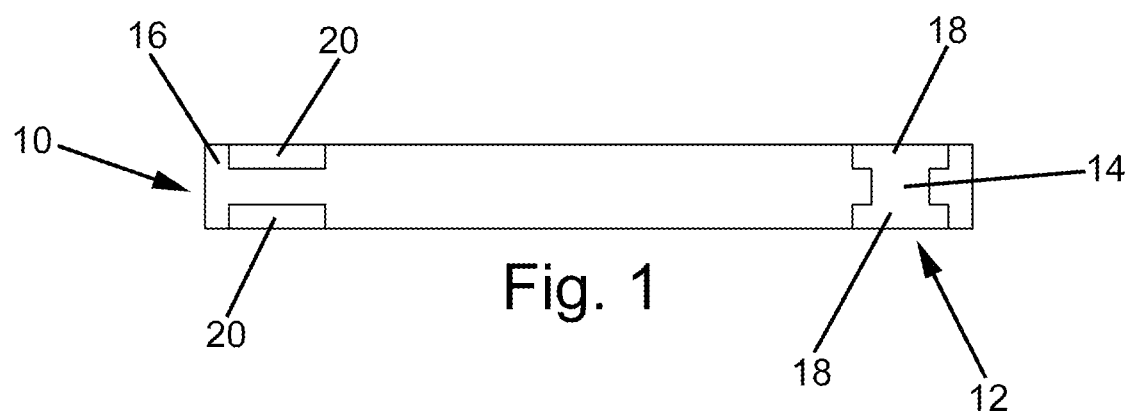
FIG. 1 is a schematic side view representation of an embodiment of the invention.
Figure 2:
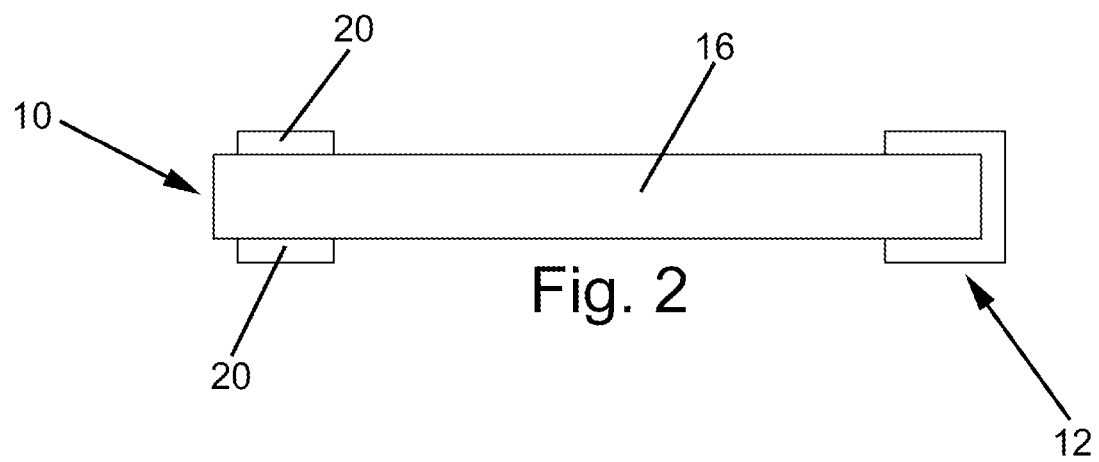
FIG. 2 is a schematic side view representation of an embodiment of the invention.

Interposers are illustrated in cross-sectional schematic view in FIGS. 1 and 2. In FIG. 1, the interposer, 10, comprises active pads, 12, formed by a via, 14, extending through the substrate, 16, thereby providing electrical contact between conducting pads, 18, on either side of the substrate. Mechanical pads, 20, are not in electrical contact with a mechanical pad opposite thereto on the substrate. In FIG. 2, the active pad, 12, is in the form of a wrap-around pad, and the mechanical pads, 20, are portions of a trace on the surface of the substrate, 16. An interposer with an active pad and a mechanical pad will be referred to herein as an active interposer.

Figure 3:
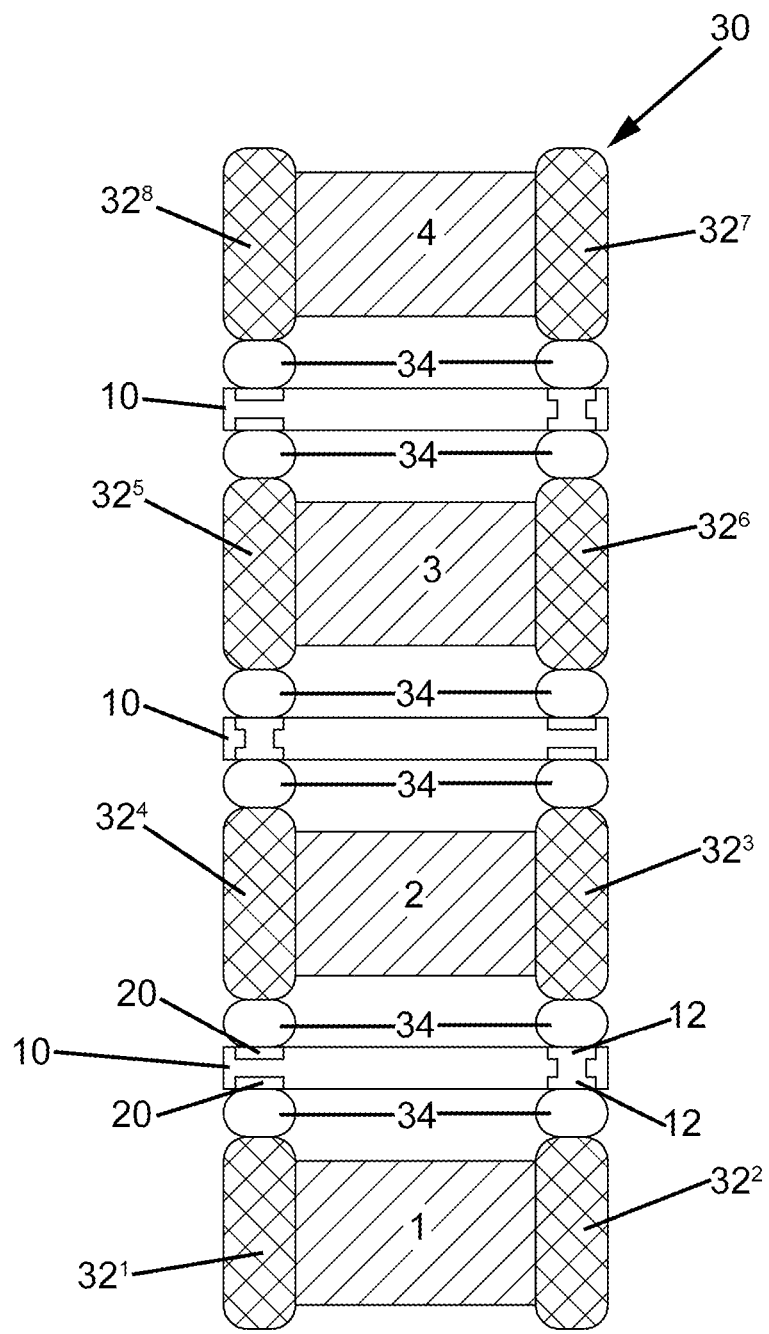
FIG. 3 is a schematic side view representation of an embodiment of the invention.

An embodiment of the invention will be described with reference to FIG. 3 wherein a high density multi-component package, 30, is illustrated in schematic side view. In FIG. 3, four electronic components are illustrated for the purposes of discussion without limit thereto. Each electronic component is arbitrarily numbered for the purposes of illustration and discussion only. In FIG. 3, interposers, 10, are between adjacent electronic components. Each electronic component has one external termination, 32, in electrical contact with an active pad, 12, and one external termination in contact with, and adhered to, a mechanical pad, 20. In FIG. 3 the active pad is represented as conducting pads on either side of the substrate electrically connected by a via. The external terminations are preferably bonded to the pads by an interconnect, 34, such as a conductive adhesive, a solder, polymer solder, TLPS bond, sintered metal interconnects, diffusion solders or direct copper bonds as will be discussed elsewhere herein. Active pads and mechanical pads of adjacent interposers alternate thereby providing for an electronic path beginning arbitrarily at external termination, $32^1$, of electronic component 1, and ending with external termination, $32^8$, of electronic component 4. The four electronic components are therefore serially connected. While four electronic components are a sufficient number to illustrate the invention it is to be understood that the invention can be extended from two components to any number of electronic components and a large variety of variations as will be realized. It is preferable that the number of components is at least two to no more than 100.

Figure 4:
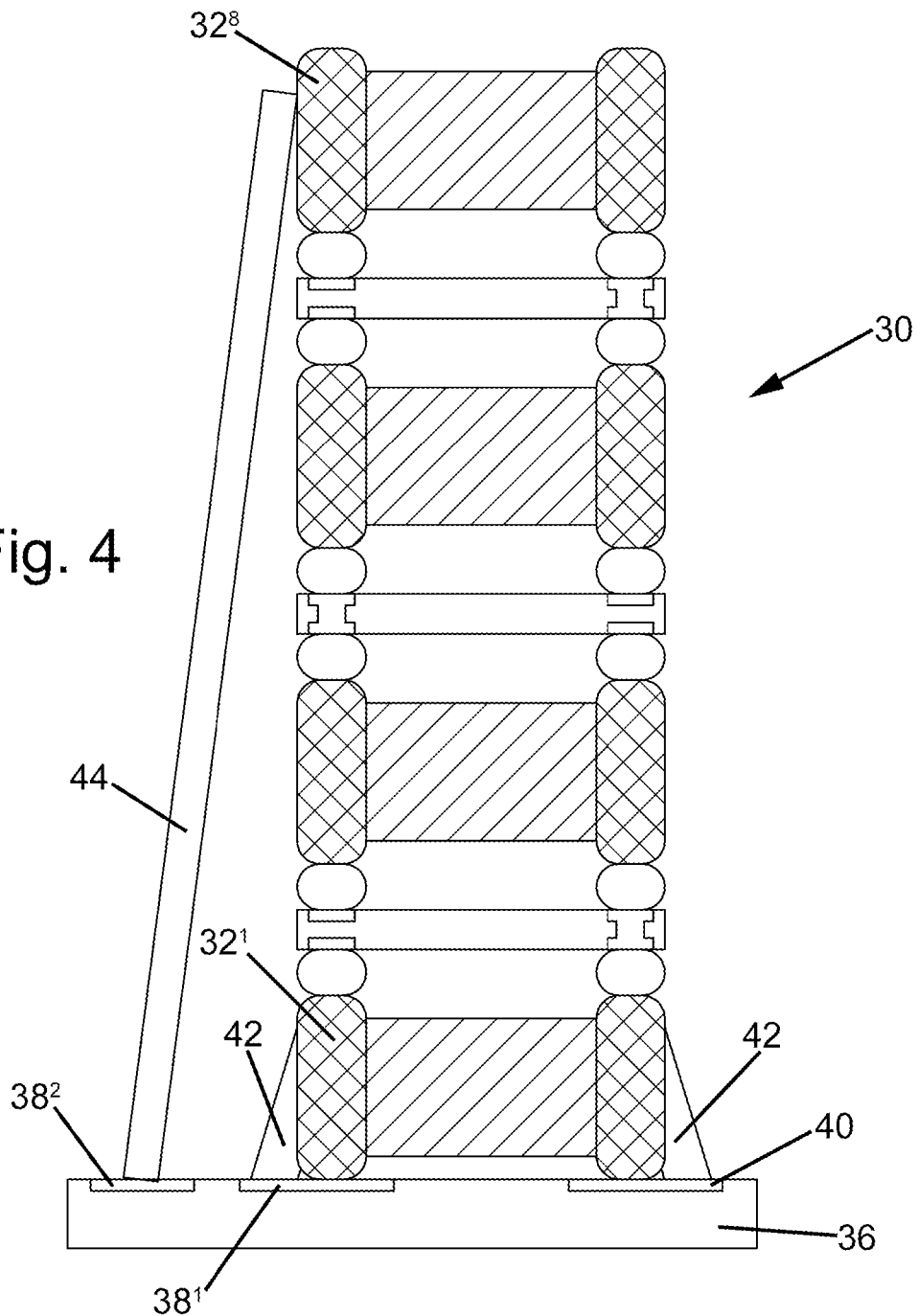
FIG. 4 is a schematic side view representation of an embodiment of the invention.

An embodiment of the invention will be described with reference to FIG. 4 wherein a high density multi-component package vertically mounted to a substrate, 36, is illustrated in schematic side view. Active circuit traces, 38, on the substrate, 36, are in functional electronic connection with external terminations, $32^1$ and $32^8$. External termination, $32^1$, is directly attached to active circuit trace $38^1$ by an interconnect, 42, which may be the same as the interconnect between the external terminations and interposers or it may be different. A connector, 44, is in electrical contact with external termination $32^8$ and active trace $38^2$ wherein the active traces, 38, are integral to the electronic circuit of a device. The connector may be an electrical connection and otherwise provide no further function or the connector may be a functional connection such as an electrical component. Particularly preferred connectors include a resistor, a fuse and an inductor. A mechanical trace, 40, provides mechanical stability and is directly attached to external termination $32^2$ by an interconnect, 42.

Figure 5:
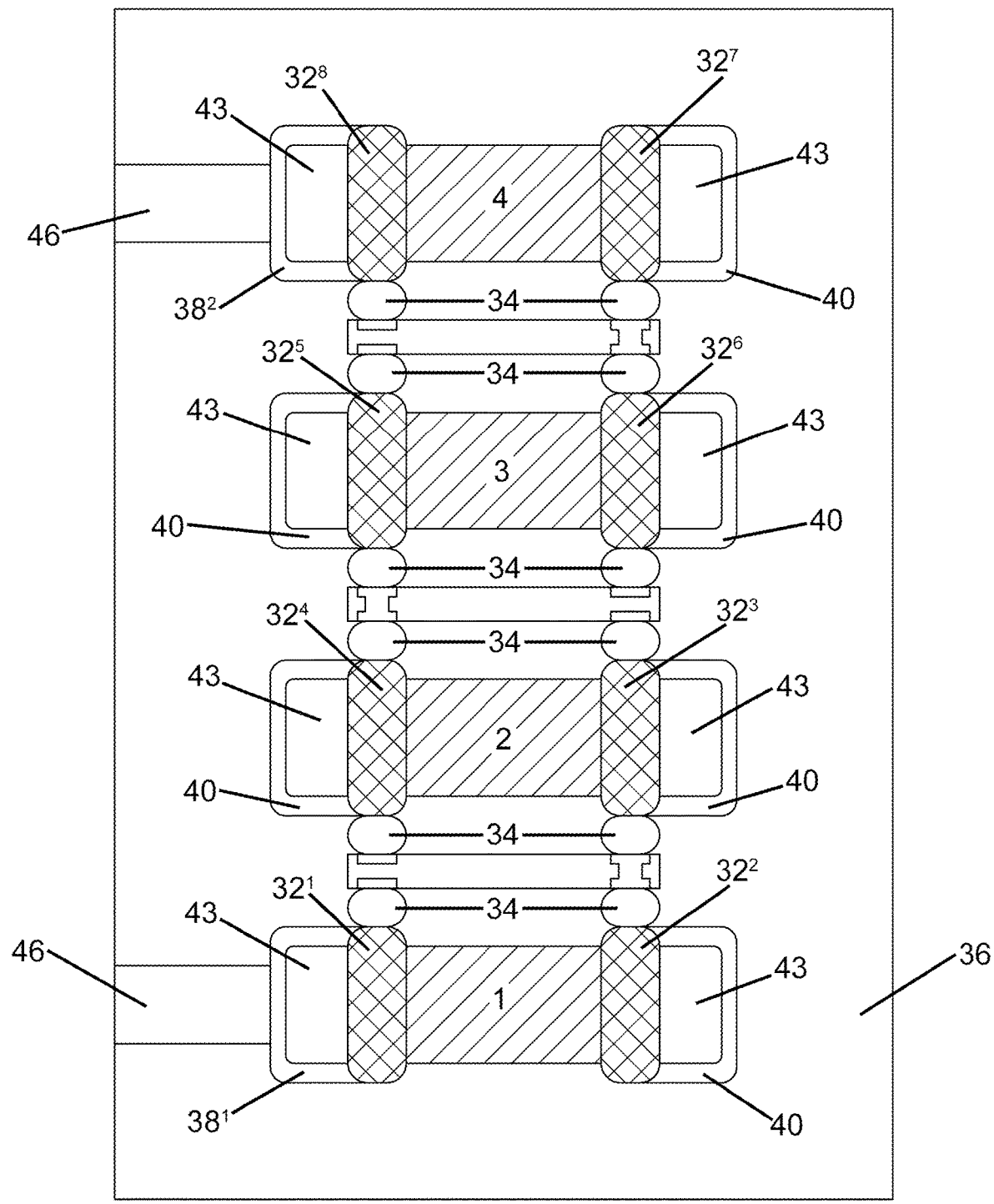
FIG. 5 is a schematic top view representation of an embodiment of the invention.

An embodiment of the invention will be described with reference to FIG. 5 wherein a high density multi-component package horizontally mounted to a circuit board, 36, is illustrated in schematic top view. In FIG. 5, each external termination, 32, is attached to a trace with external terminations $32^1$ and $32^8$ attached to active traces $38^1$ and $38^2$, respectively, which are in electrical contact with the circuit traces, 46, and the remaining external terminations are attached to mechanical traces, 40, preferably through a solder pad, 43, by an interconnect which is not shown. In FIG. 5 the electronic components are all serially connected.

Figure 6:
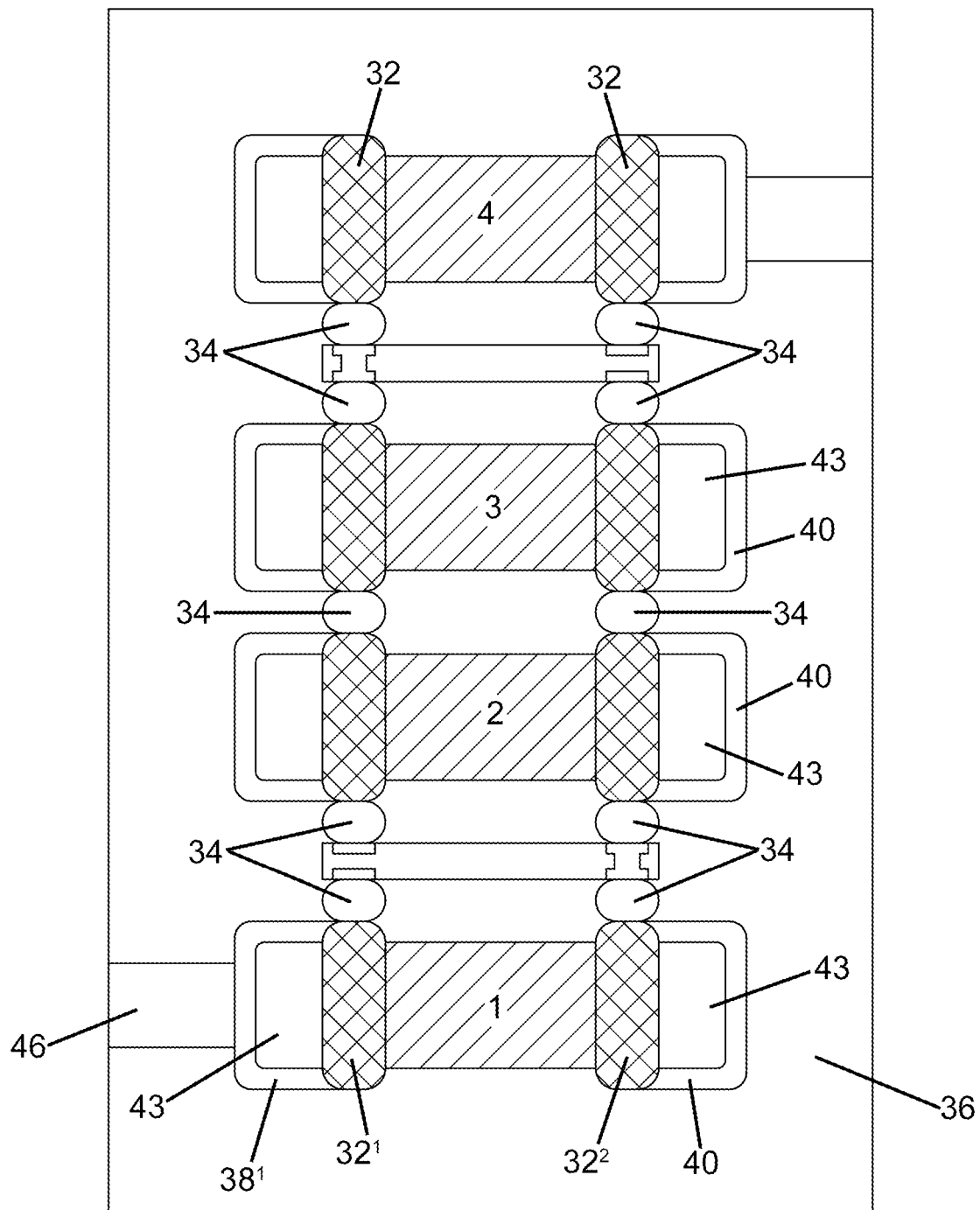
FIG. 6 is a schematic top view representation of an embodiment of the invention.
Figure 7:
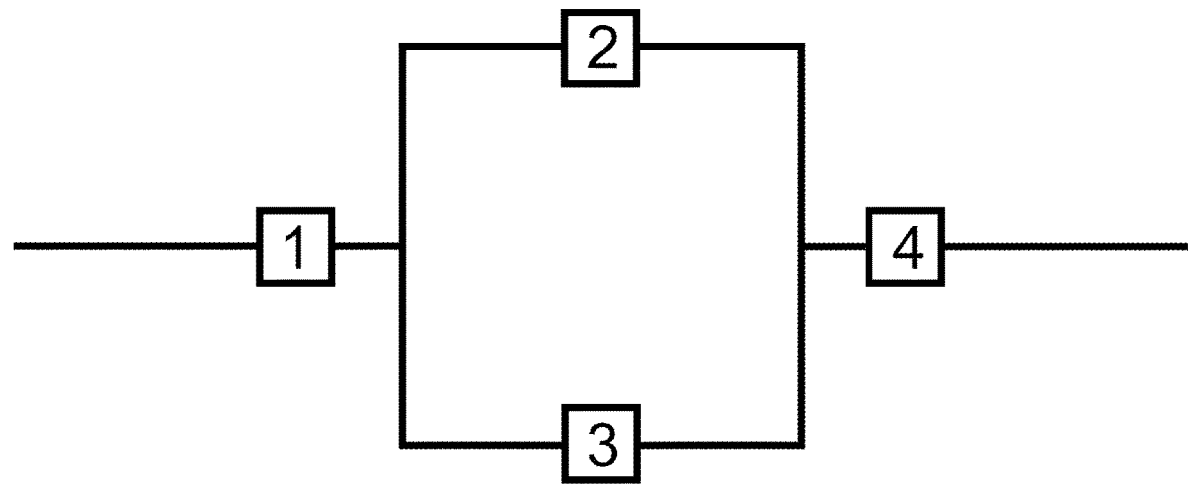
FIG. 7 is an electrical schematic representation of an embodiment of the invention.
Figure 8:
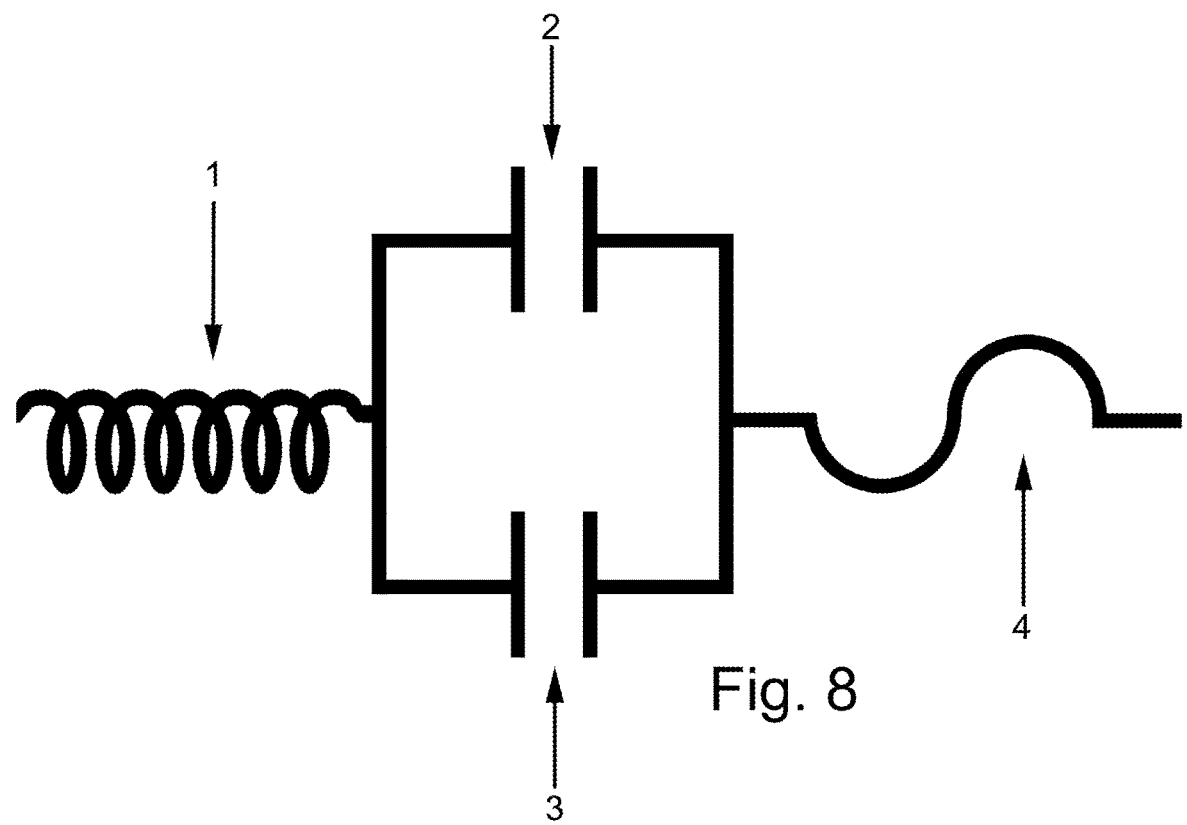
FIG. 8 is an electrical schematic representation of an embodiment of the invention.

An embodiment of the invention will be described with reference to FIG. 6 wherein a high density multi-component package is illustrated in schematic top view as mounted to a substrate, 36. In FIG. 6 electronic components 1 and 4 are mounted as illustrated and described relative to FIG. 5. Electronic components 2 and 3 have an interconnect, 34, directly there between and therefore the electronic components 2 and 3 are in electrical parallel. A generic electrical schematic diagram is illustrated in FIG. 7 wherein electronic components 2 and 3 are in electrical parallel between serially connected electronic components 1 and 4. An electrical schematic diagram is provided in FIG. 8 wherein electrical component 1 is an inductor, electrical components 2 and 3 are MLCC's and electrical component 4 is a fuse thereby providing a fused inductor capacitor high density component.

Figure 9A:
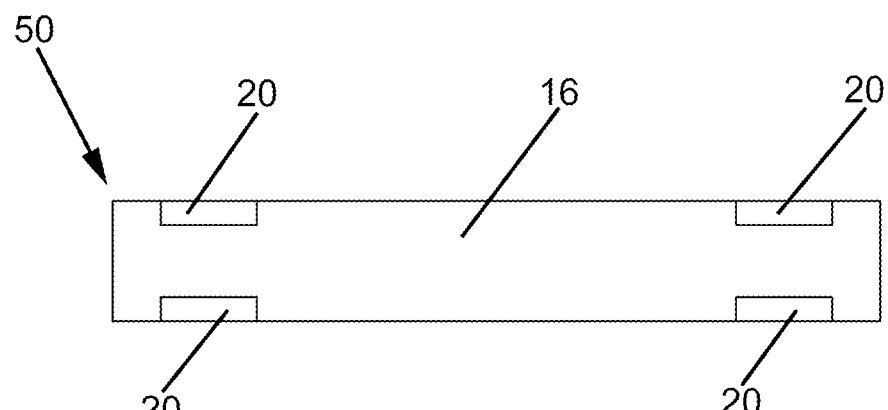
FIG. 9A is a schematic side view representation of an embodiment of the invention.
Figure 9B:
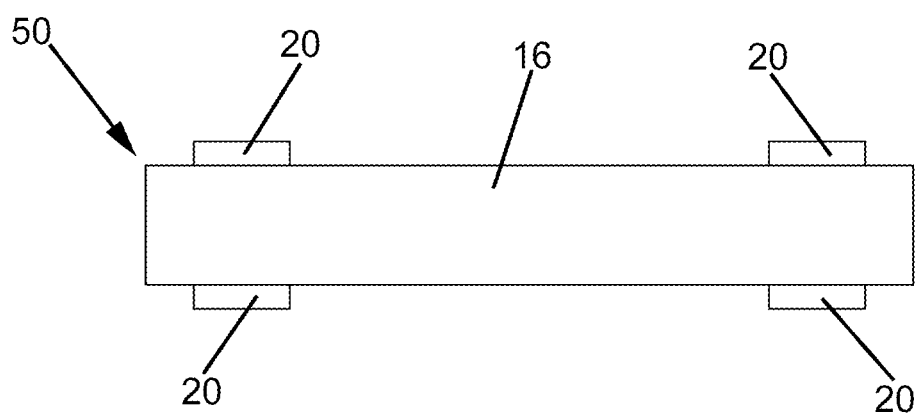
FIG. 9B is a schematic side view representation of an embodiment of the invention.

An embodiment of the invention will be described with reference to FIGS. 9A and 9B wherein interposers, 50, are illustrated. In FIG. 9A the interposer comprises mechanical pads, 20, which are not in electrical contact with a mechanical pad opposite thereto on the substrate, 16. In FIG. 9B, the mechanical pads, 20, are electrically isolated portions of a trace on the surface of the substrate, 16. The interposers illustrated in FIGS. 9A and 9B do not have an active pad, as will be realized from further discussion, and will be referred to herein as a mechanical interposer.

An embodiment of the invention will be described with reference to FIGS. 10 and 11 wherein a portion of an electronic circuit of a device is illustrated in top schematic view in FIG. 10 and side schematic view in FIG. 11. For the purposes of discussion a series of pads, 58, are numbered sequentially. Traces, 54, connecting adjacent pads are designated by the pads being electrically connected. Trace $54^{23}$, for example, provides electrical conductivity between pads $58^2$ and $58^3$. Mechanical interposers, 50, are between adjacent electronic components wherein pads $58^1$ and $58^8$ provide connectivity to the circuit by traces, 56. A secondary electrical component, 5, electrically mounted in parallel with electrical components 2 and 3 at the external termination provides a combination of serial and parallel electrical connections and component 5 does not increase the surface area of the circuit board, 36, occupied by the package. A secondary electrical component is an electrical component which is peripheral to the stack but electrically connected thereto. While demonstrated with five electrical components the number and arrangement of electrical components is not limited herein.

Figure 10:
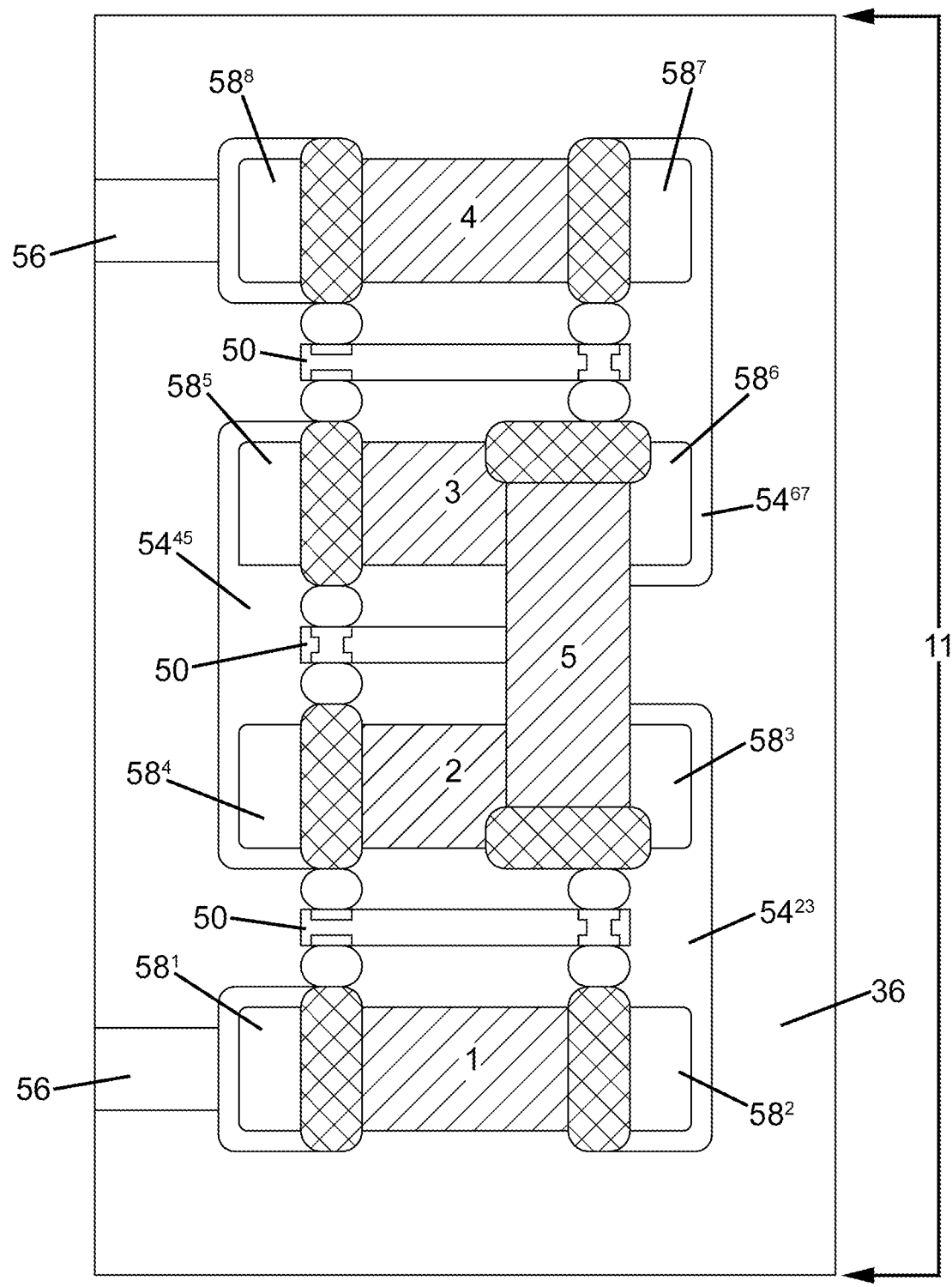
FIG. 10 is a schematic top view representation of an embodiment of the invention.
Figure 11:
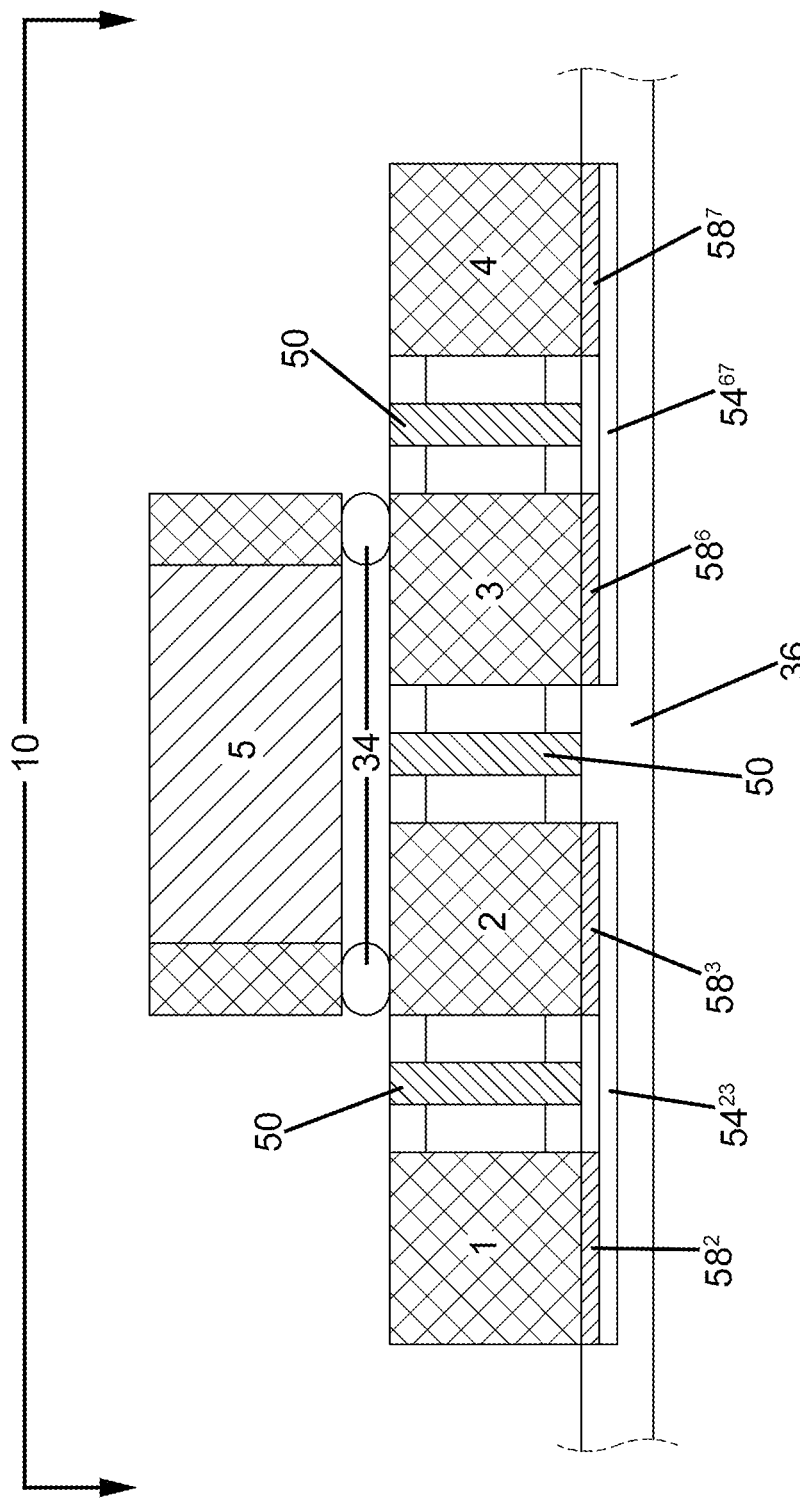
FIG. 11 is a schematic side view representation of an embodiment of the invention.
Figure 12:
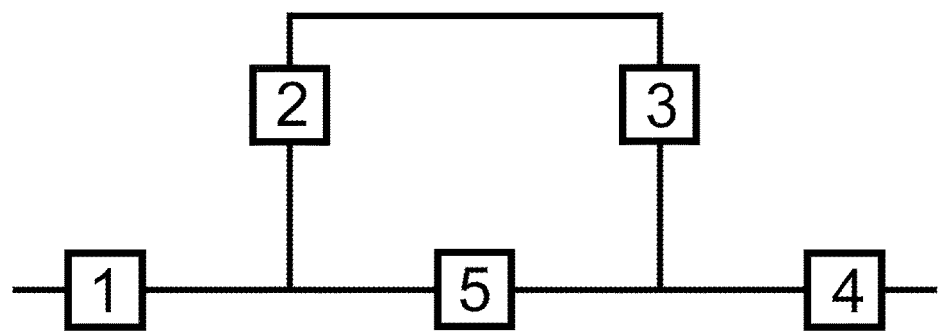
FIG. 12 is an electrical schematic representation of an embodiment of the invention.
Figure 13:
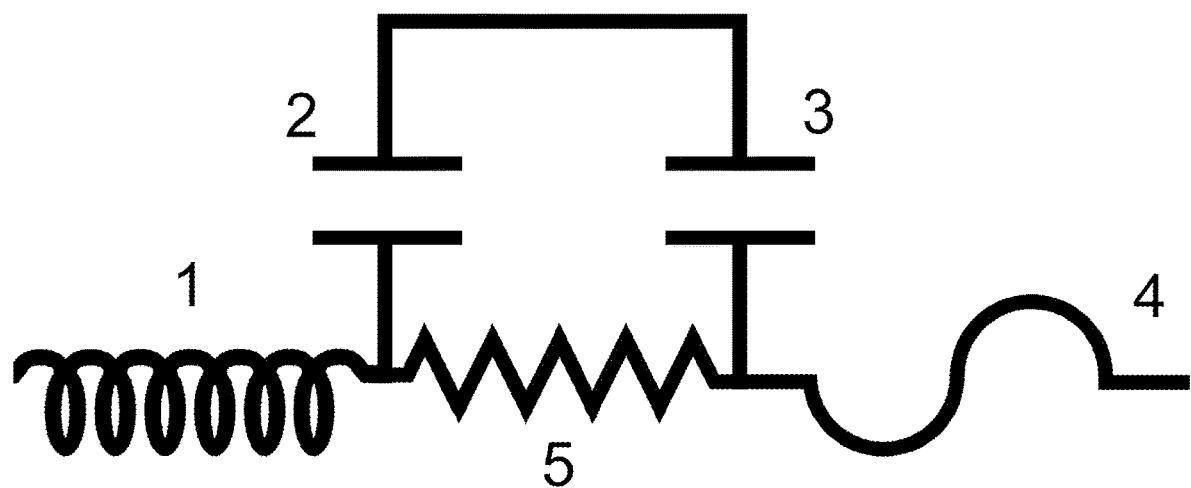
FIG. 13 is an electrical schematic representation of an embodiment of the invention.

A representative circuit diagram for the package illustrated in FIGS. 10 and 11 is provided in FIG. 12 wherein electronic components 1, 2, 3 and 4 are electrically serially connected and component 5 is electrically parallel to components 2 and 3. An exemplary embodiment is illustrated in FIG. 13 wherein electronic component 1 is an inductor, electronic components 2 and 3 are MLCC's, electronic component 5 is a resistor and electronic component 4 is a fuse.

Figure 14:
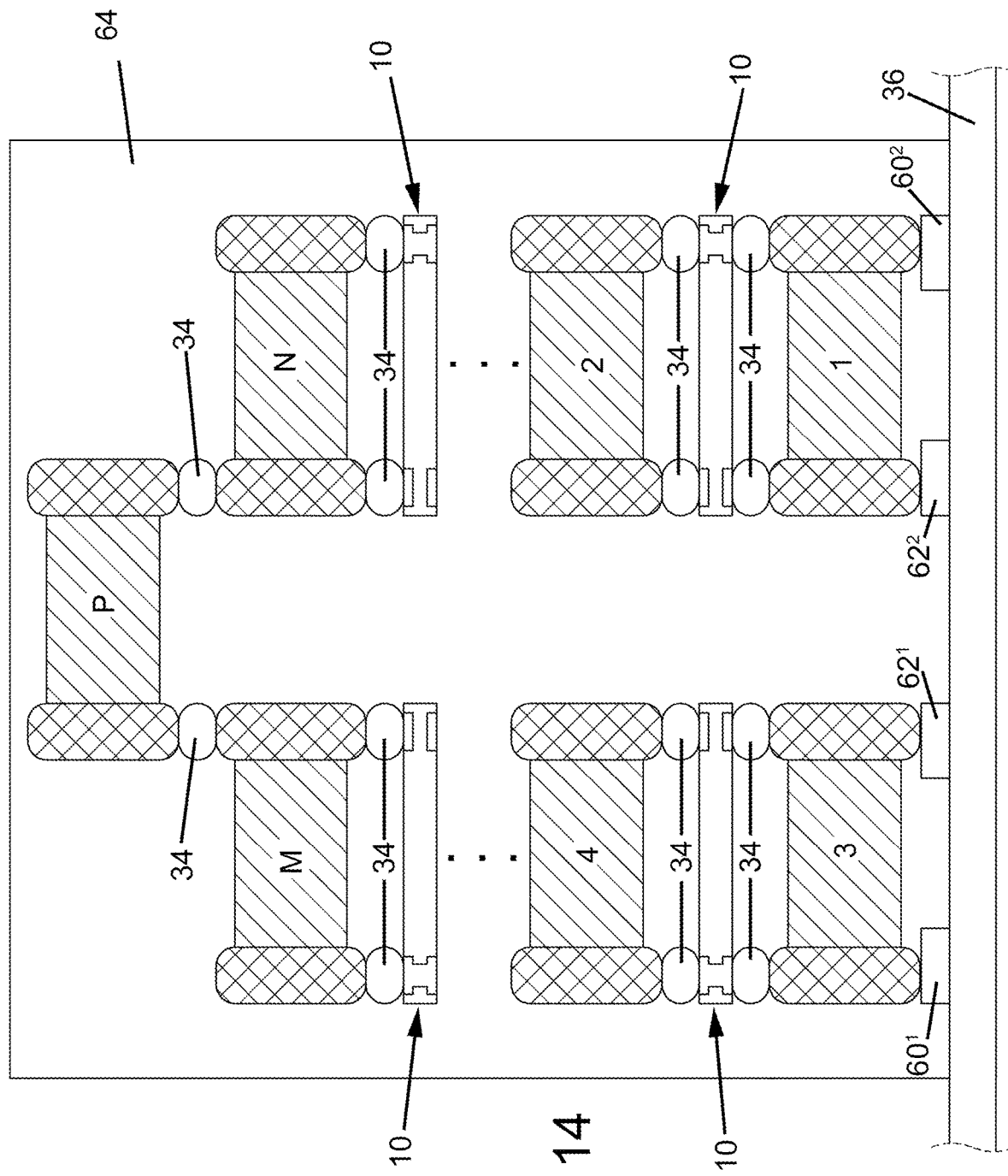
FIG. 14 is schematic side view representation of an embodiment of the invention.

An embodiment of the invention will be described with reference to FIG. 14 wherein a high density multi-component package mounted to a substrate, 36, is illustrated in partial cross-sectional schematic view. In FIG. 14, the electronic components are in parallel adjacent stacks with a secondary electronic component, P, spanning across electronic components N and M. In one embodiment electronic component P could be an interposer with two active pads and a trace there between for electrical connectivity between the active pads. As illustrated, without limit thereto, pads, 62, are active pads in electrical communication with circuit traces, not shown, and pads, 60, are mechanical pads which are not otherwise electrically connected to the circuit. An over-molding, 64, may be included to prevent surface arcing or to create a barrier to moisture penetration.

Figure 15:
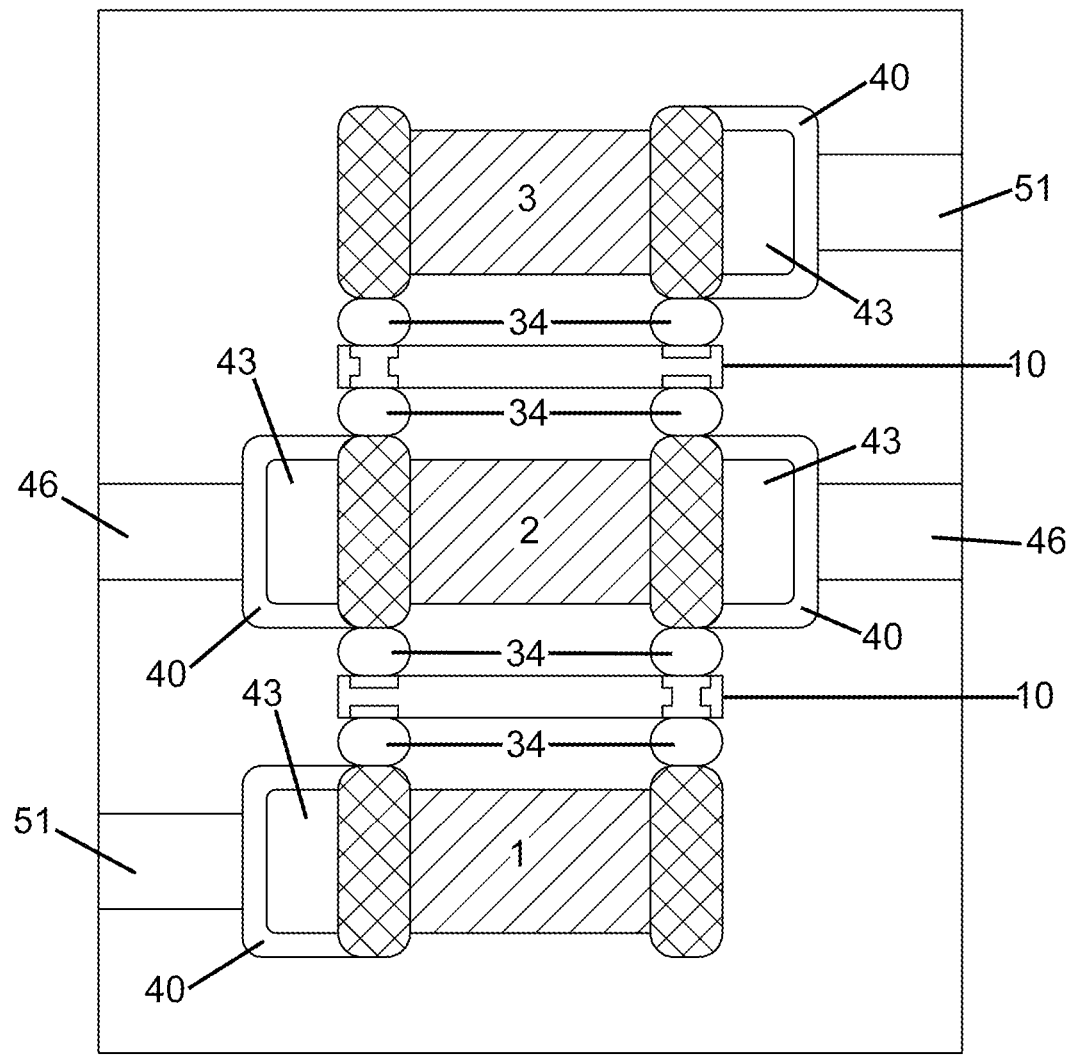
FIG. 15 is schematic side view representation of an embodiment of the invention.
Figure 16:
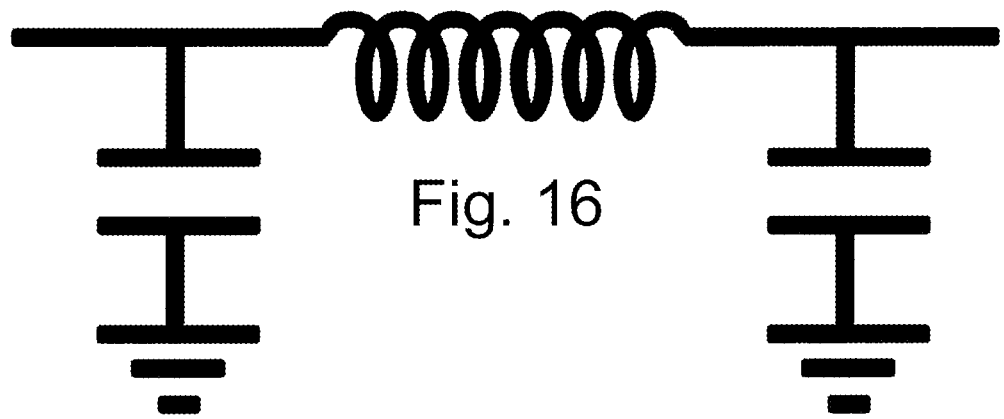
FIG. 16 is an electrical schematic representation of an embodiment of the invention.
Figure 17:
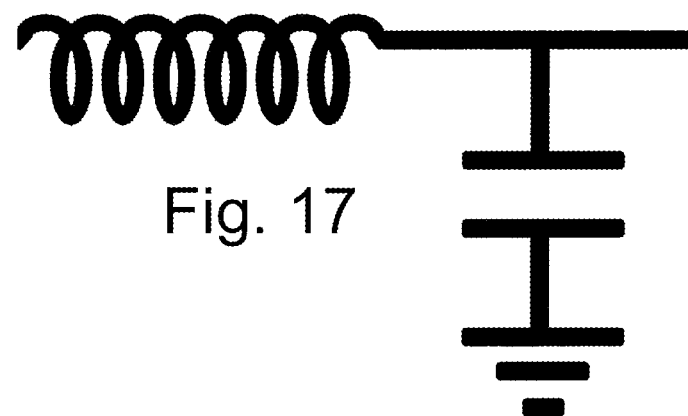
FIG. 17 is an electrical schematic representation of an embodiment of the invention.
Figure 18:
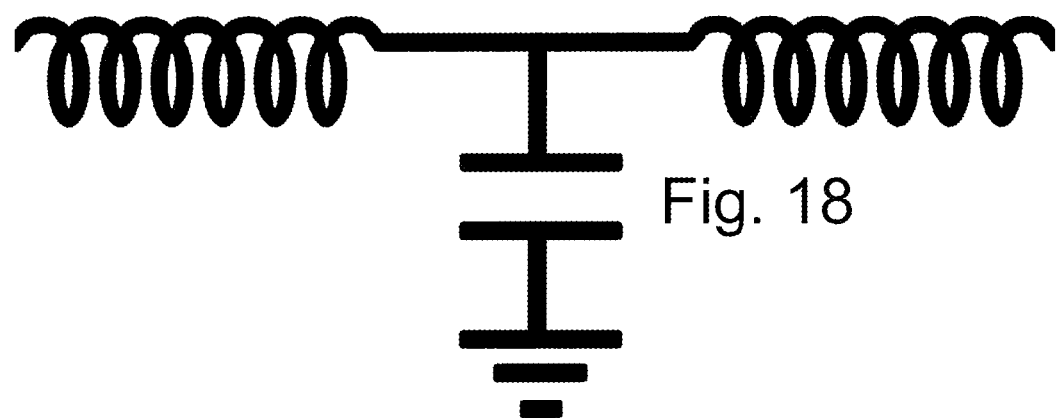
FIG. 18 is an electrical schematic representation of an embodiment of the invention.

In a further embodiment of the invention by increasing the number of active connections to the circuit board it is possible to achieve an electrical filter within a high density component package. Pi, T, and LC filters are widely used in either feed through or surface mount configurations but there is a desire to continue to miniaturize these packages and provide a high-density surface mountable solution. An example of a Pi-filter package is shown in FIG. 15 wherein electronic component 2 is an inductor and electronic components 2 and 3 are MLCC's. The input and output of the inductor is connected through an MLCC to ground traces, 51, thereby providing a Pi filter with an electrical schematic diagram illustrated in FIG. 16. Only the active circuit traces are shown in FIG. 15 and other non-active pads may be added for a mechanical bond for increased mechanical stability. An electronic schematic diagram for a "LC" filter is illustrated in FIG. 17 and an "T" filter is illustrated in FIG. 18.

Figure 19:
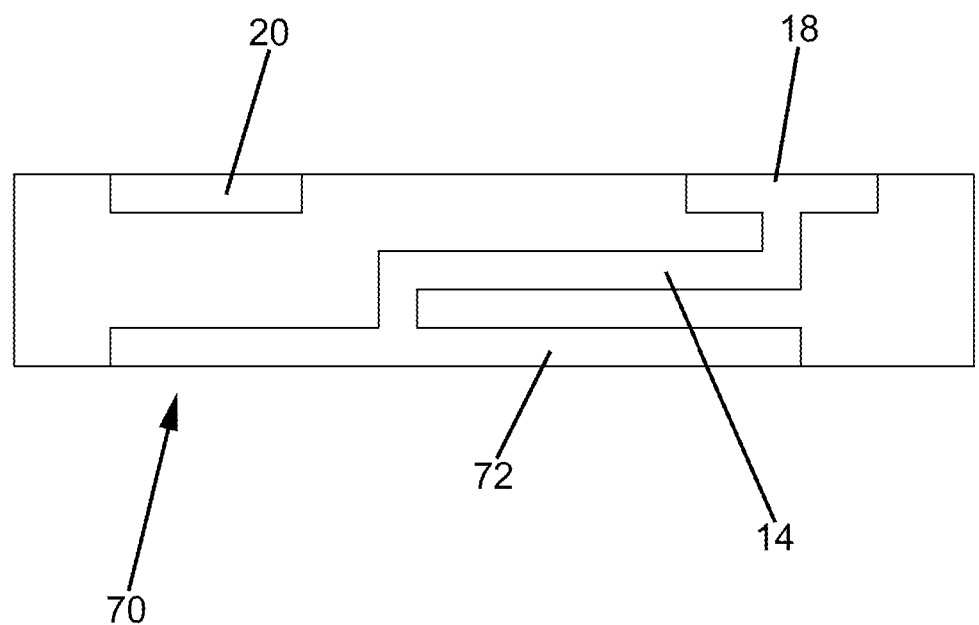
FIG. 19 is a schematic side view representation of an embodiment on the invention.
Figure 20:
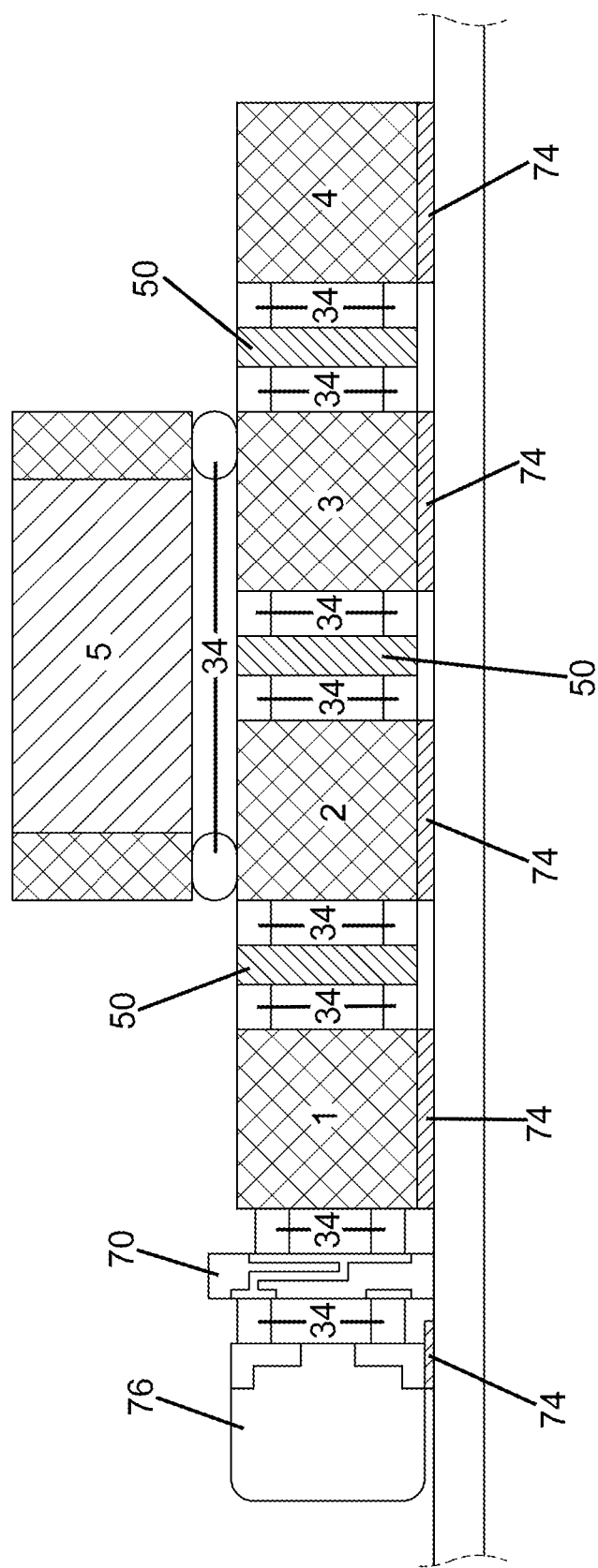
FIG. 20 is a schematic side view representation of an embodiment on the invention.

In the case where the component to be attached has a face-down termination an active interposer with a reorientation via can be used as shown in FIG. 19 wherein a a conducting pad, 18, is electrically connected by a via, 14, to a conducting pad, 72. When used as depicted in FIG. 20 one of the faced down terminals is connected to the circuit and the other to one terminal of the next component, 76, by connection to the re-orientation via to form a serial connection. Each pad, 74, independently represent either mechanical pads or conducting pads as necessary thereby allowing for flexibility in the design of the electronic components and the functionality of the high density multi-component package.

Multi-terminal components can be connected to the circuit through separate pads and the interposers can be used to accommodate components of different sizes.

A particular advantage of the instant invention is an improvement in inductance. A high density multi-component stack mounting in a horizontal direction, as in FIG. 5, reduces stray inductance as the path length between the electronic component and circuit board is reduced, and therefore so is the ESL. In the case of MLCC an ESL of 0.9 nH in the vertical direction can be achieved compared to 2.9 nH in the horizontal direction. The ESR can also be lowered that is particularly important since it directly proportional to the power dissipated when AC voltage is applied. This is particularly advantageous with MLCC because in the horizontal orientation of the electronic components the interior electrodes of the MLCC are vertical which is advantageous for inductance and the resistive length is lowered reducing ESR.

Each electronic component is preferably independently selected from the group consisting of capacitor, resistor, varistor, inductor, diode, fuse, overvoltage discharge device, sensor, switch, electrostatic discharge suppressor, semiconductor and integrated circuit. The diode may be a light emitting diode. More preferably the electronic elements are selected from the group consisting of capacitor, resistor, varistor, inductor, diode, fuse, overvoltage discharge device, sensor, switch and electrostatic discharge suppressor. It is preferred that the capacitor is an MLCC and more preferably at least one of the electronic components is an MLCC.

The external terminations of the electronic components are not particularly limited herein with the proviso that they can be attached to a pad, either active or mechanical, by an interconnect such as solder, conductive adhesive, polymer solder, TLPS bond, sintered metal interconnects, diffusion solders or direct copper bonds. TLPS is the preferred interconnect between the external termination of the electronic component and pad. The external termination may be one component of TLPS, as will be more fully described herein, wherein additional components of the TLPS are either inserted between the external termination to be bound or is integral to the surface to which the external termination is to be bound. The TLPS materials are compatible with surface finishes containing silver, tin, gold, copper, platinum, palladium, nickel, or combinations thereof, either as lead frame finishes, component connections or inner electrodes to form an electronically conductive metallurgical bond between two surfaces.

Transient liquid phase sintering (TLPS) adhesives form a termination to an electronic element or attach external terminations to a surface such as a solder pad thereby functioning as an interconnect. TLPS terminations have the advantage of being able to accommodate different surface finishes as well as electronic elements of differing lengths. Furthermore, since no solder balls are formed electronic elements can be stacked on top of each other with only TLPS there between and without the gaps normally required for cleaning as with solder attachment technology. TLPS can be directly bonded with the inner electrodes of the electronic component, when the electronic element is an MLCC, and the termination can be formed at low temperature. In an embodiment higher density terminations can be prepared by using a thermo-compression process thereby forming improved external lead attachment bonds.

Solders are alloys which do not undergo a change in composition after the first reflow. Solders have only one melting point and can be remelted an indefinite number of times. The most common solder is 60%Sn40%Pb. Solders have been the materials of choice in electronics to provide the mechanical and electrical interconnects between electronic elements and circuit boards or substrates. Solders are very well suited for mass volume production assembly processes. The physical properties of solder can be altered simply by changing the ratios or the metals used to create a solder alloy. When solder is referenced herein it will imply an alloy of at least two metals that can be remelted multiple times at nearly the same temperature.

Transient liquid phase sintering (TLPS) bonds are distinguishable from solders. TLPS materials are mixtures of two or more metals or metal alloys prior to exposure to elevated temperatures thereby distinguishing the thermal history of the material. TLPS materials exhibit a low melting point prior to exposure to elevated temperatures, and a higher melting point following exposure to these temperatures. The initial melting point is the result of the low temperature metal or an alloy of two low temperature metals. The second melting temperature is that of the intermetallic formed when the low temperature metal or alloy forms a new alloy with a high temperature melting point metal thereby creating an intermetallic having a higher melting point. TLPS materials form a metallurgical bond between the metal surfaces to be joined. Unlike tin/lead or lead (Pb) free solders, the TLPS adhesives do not spread as they form the intermetallic joint. Rework of the TLPS system is very difficult due to the high secondary reflow temperatures. Transient Liquid Phase Sintering is the terminology given to a process to describe the resulting metallurgical condition when two or more TLPS compatible materials are brought in contact with one another and raised to a temperature sufficient to melt the low temperature metal. To create a TLPS process or interconnect at least one of those metals is from a family of metals having a low melting point, such as tin (Sn) or indium (In), and the second metal is from a family having high melting points, such as copper (Cu) or silver (Ag). When Sn and Cu are brought together, and the temperature elevated, the Sn and Cu form CuSn intermetallics and the resulting melting point is higher than the melting point of the metal having a low melting point. In the case of In and Ag, when sufficient heat is applied to the In to cause it to melt it actually diffuses into the Ag creating a solid solution which in turn has a higher melting point than the In itself. TLPS will be used to generically reference the process and the TLPS compatible materials used to create a metallurgical bond between two or more TLPS compatible metals. TLPS provides an electrical and mechanical interconnect that can be formed at a relatively low temperature (<300° C.) and having a secondary re-melt temperature >600° C. These temperatures are determined by the different combination of TLPS compatible metals. TLPS will be used to generically pertain to the process and materials used to create a TLPS metallurgical bond or interconnect. The rate of diffusion or sintering is a time temperature function and is different for the different combinations of metals. The result is a solid solution having a new melt temperature approaching that of the high temperature melting metal.

The TLPS technology is particularly suited to providing both a mechanical and electrical conductive metallurgical bond between two mating surfaces preferably that are relatively flat. The metals typically used for the TLPS process are selected from two metal families. One consists of low melting temperature metals such as indium, tin, lead, antimony, bismuth, cadmium, zinc, gallium, tellurium, mercury, thallium, selenium, or polonium and a second family consist of high temperature melting metals such as silver, copper, aluminum, gold, platinum, palladium, beryllium, rhodium, nickel, cobalt, iron and molybdenum to create a diffused solid solution.

It is highly desirable to use a flux free process to eliminate any potential voids within the joint. Since TLPS is a sintering based process, the bond line is uniform and void free. Fluxes, which are necessary with solders, get entrapped in the joint and are subsequently burned out leaving a void. In the case with the semi-conductor industry, and specifically with die attach processes, these voids can create hot spots within the integrated circuit (I/C) which can lead to premature failure and reliability issues. TLPS addresses this issue since TLPS is a sintering process and free of fluxes. When the two metals are mated together and heat is applied, the lower melting metal diffuses into the higher melting metal to create a solid solution across the mating surface area. To create a solid uniform bond line it is mandatory that the mating surfaces be flat and coplanar to insure intimate contact across the entire mating surface. The required flatness of the mating surfaces also limits the application of this technology because there are many surfaces that are not sufficiently planar to yield a good joint.

The use of TLPS in paste form allows uneven surfaces to be joined. More specifically, the use of TLPS in paste form allows two irregular shaped surfaces to be joined with no intimate, or continuous, line of contact. A TLPS compatible metal particle core combined with a liquid carrier material to form a paste can be applied between two non-planar non-uniform surfaces having mixed surface preparation technologies such as plating, sintered thick film, and or plated sintered thick film and then heating to the melting temperature of the metal having the lowest melting point and holding that temperature for a sufficient amount of time to form a joint. A single metal particle core eliminates the need for multiple metals in a paste thus making the ratios of metals a non-issue. It is also possible to create a single particle by using silver, a metal having a high melting point of approximately 960° C. as a core particle, and then coating that particle with a metal shell having a low temperature metal such as indium having a melting point of 157° C.

A two-step reflow can also be used with the transient liquid phase sintering process wherein in the first step an electrically conductive metallurgical bond is formed at low temperature using a relatively short time cycle, in the range of 5 seconds to 5 minutes, and low temperature, in the range of 180° C. to 280° C., depending on the metals being used in the TLPS alloying process. In the second step the part is subjected to an isothermal aging process using a temperature range of 200° C. to 300° C. for a longer duration such as, but not limited to, 5 minutes to 60 minutes. The shorter times required to form the initial bond are well suited for an automated process. In another method a single step process can be used wherein the TLPS forms a terminal, or conductive metallurgical bond, between the external leads and electronic element(s) at temperatures of, for example, 250° C. to 325° C. for a duration of, for example, 10 seconds to 30 seconds. Lower temperatures, such as 175° C. to 210° C., can be used for a longer duration, such as 10 to 30 minutes. This is particularly useful when the electronic component itself is sensitive to temperature.

Indium powder mixed with a flux and solvent to form a paste can be applied to produce a TLPS metallurgical bond between two coupons having a base metal of copper overplated with Ni and then overplated with about 5 microns (200 μ inches) of silver. The samples can be prepared by dispensing the indium paste onto a coupon having the plated surfaces as mentioned and then placing two coupons in contact with one another and heating to 150° C. for 5 seconds, followed by increasing the temperature to about 320° C. for about 60 seconds. The joint strength of the sample thus prepared can exhibit a pull weight in the range of 85-94 pounds equating to shear stress of 4,177 psi and a pull peel weight in the range of 5-9 pounds with an average of 7 pounds can be achieved. These results are comparable to results for SnPb solders having shear strengths of approximately 3000 psi and pull peel strengths in the 7-10 pounds range. One major difference is that the AgIn joint can withstand secondary melt temperatures exceeding 600° C. These results indicate that the In paste used to bond two silver plated coupons is at least equivalent if not stronger than current solder SnPb solders but also has a much higher secondary melt temperature thus yielding a material suitable for high temperature interconnect applications and also being lead free. The TLPS paste or preform may have inert fillers therein to serve two purposes. One purpose is to minimize the cost due to expensive metals and the second purpose is to make direct electrical and metallurgical bonds directly to the non-terminated ends of the electronic element and exposed internal electrodes. The cost can be reduced, particularly, when a gap is to be filled by replacing a portion of, particularly, the high melting metal component with an inert material or with a lower cost conductive material. Particularly preferred fillers for use in place of the high melting point metal are non-metals such as ceramics with melting points >300° C. and glasses or high temperature polymers with glass transition temperatures ($T_g$)>200° C. An example would be thermosetting polymers such as polyimide. Two particular advantages of replacing the high melting point metal with one of these non-metals is that the active low melting point metal of the TLPS with not be consumed by diffusion during the TLPS bond formation. The second advantage of inert fillers when selected from a family of glasses having low melting points is that the glass within the mixture of the TLPS paste or preform will create a bond with the exposed glass frit of the non-terminated and exposed ceramic body of, for example, an MLCC. The non-metals can also be coated with the low melting point metal by methods such a spraying or plating.

Sintered metal interconnects of silver as well as nano-silver and nano-copper can also be used to form interconnects. The resulting interconnect can be formed at using a low temperature sintering process but the bond formed has the high melting point of the associated with the metal, in the case of silver 960° C. However, these processes often require elevated pressures for prolonged times in batch operation that can limit throughput compared CuSn TLPS. Also, nano-sized metals can be prohibitively expensive.

Diffusion soldering can also be used as a joining method to form the interconnect. This combines features of conventional soldering and diffusion bonding processes. The process relies on reaction between a thin layer of molten solder and metal on the components to form one or more intermetallic phases that are solid at the joining temperature. Since a low melting point material, solder reacts with a higher melting point metal this may also be considered in the broader definition of TLPS.

Direct copper bonding can also be used but this is a high temperature diffusion process primarily used in die attach so could be detrimental to some components.

Methods to adhere an external termination to a solder pad can comprise coating two mating surfaces one with a high melting point metal and its mating surface with a low melting point metal. The coating process may consist of vapor deposition or plating. A second method is to sandwich a preform film made from a low melting point metal or an alloy of two or more low melting point metals between two planar surfaces coated with a high melting point metal. A third method is to create a paste consisting of particles of a high melting point metal such as copper and then adding particles of two alloyed low melting point metals and mixed into a dual purpose liquid that cleans the surfaces to be bonded and also serves as the liquid ingredient to the metal particles to form a paste mixture.

If full diffusion of the two metals is not complete in the stated cycle time and the maximum secondary reflow temperature is not reached, the joint can be subjected to a second heating process. In this case the joint, or assembly, can be subjected to a temperature higher than that of the low melting point material and held for a period of time of from 15 minutes up to 2 hours. The time and temperature can be varied to provide a desirable secondary reflow temperature as dictated by secondary assembly processes or final environmental application requirements. In the case of the indium/silver TLPS, secondary melt temperatures in excess of 600° C. can be achieved.

In addition to applying a paste to form a TLPS alloy joint between suitable surfaces this can also be achieved with a preform. In its simplest manifestation the preform can be a thin foil of the low temperature TLPS component. Alternatively, the preform can be produced by casting and drying the paste to remove the solvent. The resulting solid preform can be placed between the surfaces to be bonded. In this case it may be necessary to add a suitable binder to the paste for additional strength after drying. In all these cases the preform should be malleable such that it can conform to the surfaces to be bonded.

An interconnect comprising a single metal, such as indium, contained within a paste can be used to form a bond to a surface coated with a high melting point metal, such as silver. The diffusion of the indium into silver allows a lower temperature transient liquid phase to form that subsequently reacts to achieve a higher temperature bond. Achieving a high rate of diffusion in the lower melting point paste is critical to this bond formation. In order to achieve the desired properties in the final joint, such as reduced voids and a homogeneous phase the addition of other metals to the paste may be desirable. However, it is critical to retain the high diffusivity of the low melting point material. For this reason if one or more metals are required in addition to the low melting point metal it is preferred that these be incorporated by coating the metal powders prior to forming the paste. Coating the lowest melting point metal onto the higher melting point metal is preferred to retain an active surface. Coatings also have the desired effect of reducing the diffusion lengths between the different metallic elements of the paste allowing preferred phases to be more readily formed as opposed to a simple mixing of one or more additional metal powders to the single metal paste.

Conductive adhesives are typically cross linking polymers filled with silver or gold particles that cure or cross link within a specified temperature range, generally 150° C., to form a mechanical bond to the materials to be joined. Their conductivity is created by the metal particles making intimate contact with one another, within the confines of the polymer matrix, to form an electrically conductive path from one particle to another. Because the binder is organic in nature, they have relatively low temperature capabilities, normally in the range of about 150° C. to about 300° C. Conductive epoxies, once cured, cannot be reworked. Unlike TLPS bonds, exposure to high heat or corrosive environments may decompose the polymeric bonds and oxidize the metal particles degrading the electrical properties. Both the electrical and mechanical performance of the interconnect can be compromised resulting in increased ESR and decreased mechanical strength.

Polymer solders may comprise conventional solder systems based on Pb/Sn alloy systems or lead free systems, such as Sn/Sb, which are combined with crosslinking polymers which serve as cleaning agents. The cross-linked polymers also have the ability to form a cross-linked polymer bond, such as an epoxy bond, that forms during the melting phase of the metals thereby forming a solder alloy and a mechanical polymeric bond. An advantage of polymer solders is that the polymeric bond provides additional mechanical bond strength at temperatures above the melting point of the solder, thus giving the solder joint a higher operating temperature in the range of about 5 to 80° C. above the melting point of the solder. Polymer solders combine current solder alloys with a cross linking polymer within the same paste to provide both a metallurgical bond and a mechanical bond when cured, such as by heating, to provide additional solder joint strength at elevated temperatures. However, the upper temperature limits and joint strength has been increased, just by the physical properties of the materials. A practical limit of 300° C. remains whereas the bonds created by TLPS can achieve higher temperatures.

In many applications a high degree of porosity may be acceptable. However, in harsh environments, such a high humidity or in circuit board mounting processes, high porosity is not desirable since water or other chemicals may penetrate through the bond which may cause the bond to fail. A preferred embodiment of this invention is therefore to form a low porosity termination within the transient liquid phase sintering joint using a thermo-compression bonding process. This process has the added advantage of using a low process time of 15 to 30 seconds at a temperature in the range of 225° C. to 300° C. in a single step making it suitable for automation. Robust joints can be created for the application of attaching external leads to electronic elements, when leads are used, with a one-step low temperature in less than 30 seconds and in combination with thermo-compression bonding.

Thermo compression bonding is also a preferred processing method when using polymer solder because it assists in the formation of a high-density metallurgical bond between the contacting surfaces. The advantages of thermo-compression include a more robust bond with respect to secondary attachment processes and attachments with higher strength are achieved. A compressive force of 0.5 to 4.5 Kilograms/cm2 (7.1 to 64 psi) and more preferably 0.6 to 0.8 Kilograms/cm2 (8.5 to 11 psi) is sufficient for demonstration of the thermo-compression teachings herein. About 0.63 Kilograms/cm2 (9 psi) is a particularly suitable pressure for demonstration of the teachings.

It is highly desirable to create a joint with minimum porosity that exhibits the following characteristics: strong mechanical strength in excess of 5 Lbs./inch for Pull Peel test, Tensile, and Shear high electrical conductivity, low initial process temperature in the range of 150° C. to 225° C., a secondary reflow temperature in excess of 300° C. or higher, between non uniform surfaces making intimate contact or having gaps up to 0.015 inches.

The substrate, or circuit boards, are not particularly limiting herein with standard PCB materials including FR4, polyimides, perflouroelastomers, Kapton, PEEK or electronic grade ceramic such as $Al_2O_3$ (alumina oxide) or yttria stabilized zirconia being suitable for demonstration of the invention. Another consideration and design form uses either ferrous alloys such as Alloy 42, Invar, or Kovar or non-ferrous materials such as Cu, Phosphor Bronze, BeCu.

The invention has been described with reference to the preferred embodiments without limit thereto. Additional embodiments and improvements may be realized which are not specifically set forth herein but which are within the scope of the invention as more specifically set forth in the claims appended hereto.

The invention claimed is:
1. A high density multi-component package comprising:
   at least two electronic components wherein each electronic component comprises a first external termination and a second external termination;
   at least one interposer, each interposer of said at least one interposer between respective adjacent electronic components, said respective adjacent electronic compo- nents attached to said interposer of said at least one interposer by an interconnect,
wherein said respective adjacent electronic components are connected serially,
wherein each interposer of said at least one interposer is individually selected from an active interposer and a mechanical interposer,
wherein an active interposer comprises active pads, mechanical pads, and a substrate, each active pad is in electrical contact with a corresponding active pad on an opposite side of the substrate, each mechanical pad is not in electrical contact with a corresponding mechanical pad on the opposite side of the substrate, wherein for at least one of said respective adjacent electronic components, the first external termination is electrically connected by one of said two of said active pads opposing each other on the substrate, and the second external termination is in contact with and adhered to a respective one of two of said mechanical pads but not electrically connected to the other of said two mechanical pads, said two mechanical pads opposing each other on the substrate, and
wherein a mechanical interposer comprises a substrate and mechanical pads and does not have an active pad.

2. The high density multi-component package of claim 1 wherein said at least one interposer comprises an active interposer.

3. The high density multi-component package of claim 1 wherein said at least one interposer comprises a mechanical interposer.

4. The high density multi-component package of claim 1 wherein each said electronic components are independently selected from the group consisting of capacitor, resistor, varistor, inductor, diode, fuse, overvoltage discharge device, sensor, switch, electrostatic discharge suppressor, semiconductor and integrated circuit.

5. The high density multi-component package of claim 4 wherein at least one said electronic components is an MLCC.

6. The high density multi-component package of claim 4 wherein each said electronic components are independently selected from the group consisting of MLCC, resistor, varistor, inductor, diode, fuse, overvoltage discharge device, sensor, switch and electrostatic discharge suppressor.

7. The high density multi-component package of claim 6 wherein at least one said electronic components is an MLCC.

8. The high density multi-component package of claim 6 wherein at least one of said electronic components is a light emitting diode.

9. The high density multi-component package of claim 1 wherein all electronic components are serially connected.

10. The high density multi-component package of claim 1, further comprising at least two additional electronic components, wherein said at least two additional electronic components are electrically connected in parallel.

11. The high density multi-component package of claim 1 comprising multiple interposers of said at least one interposer individually selected from an active interposer and a mechanical interposer.

12. The high density multi-component package of claim 11 wherein each interposer of said multiple interposers is an active interposer.

13. The high density multi-component package of claim 11 wherein each interposer of said multiple interposers is a mechanical interposer.

14. The high density multi-component package of claim 11 wherein said multiple interposers comprises at least one active interposer and at least one mechanical interposer.

15. The high density multi-component package of claim 1 wherein at least one component of said electronic components is directly attached to an adjacent component by said interconnect.

16. The high density multi-component package of claim 1 wherein said electronic components form at least one stack.

17. The high density multi-component package of claim 16 further comprising a secondary electrical component.

18. The high density multi-component package of claim 17 comprising at least two stacks wherein said secondary electrical component spans said stacks.

19. The high density multi-component package of claim 17 wherein said secondary electrical component is in electrical parallel with at least two said electronic components.

20. The high density multi-component package of claim 1 wherein at least one said interconnect is selected from the group consisting of solder, conductive adhesive, polymer solder and transient liquid phase sintering adhesive.

21. The high density multi-component package of claim 20, wherein said at least one said interconnect is transient liquid phase sintering adhesive comprising a high melting point metal and a low melting point metal.

22. The high density multi-component package of claim 21 wherein said low melting point metal is selected from the group consisting of indium, tin, lead, antimony, bismuth, cadmium, zinc, gallium, tellurium, mercury, thallium, selenium, or polonium.

23. The high density multi-component package of claim 22 wherein said high melting point metal is selected from the group consisting of silver, copper, aluminum, gold, platinum, palladium, beryllium, rhodium, nickel, cobalt, iron and molybdenum.

24. The high density multi-component package of claim 22 wherein said transient liquid phase sintering adhesive comprises tin and copper or indium and silver.

25. The high density multi-component package of claim 1 wherein at least one said external terminations comprises a metal selected from the group consisting of silver, tin, gold, copper, platinum, palladium and nickel.

26. The high density multi-component package of claim 1 selected from the group consisting of a Pi filter, a T filter and an LC filter.

27. An electronic circuit comprising:
a high density multi-component package comprising:
at least two electronic components wherein each electronic component comprises a first external termination and a second external termination;
an interposer between adjacent electronic components, wherein said interposer is selected from an active interposer and a mechanical interposer,
wherein an active interposer comprises active pads, mechanical pads, and a substrate, each active pad is in electrical contact with a corresponding active pad on an opposite side of the substrate, each mechanical pad is not in electrical contact with a corresponding mechanical pad on the opposite side of the substrate, wherein for at least one of said adjacent electronic components, the first external termination is electrically connected by one of said two of said active pads opposing each other on the substrate, and the second external termination is in contact with and adhered to a respective one of two of said mechanical pads but not electrically connected to the other of said two mechanical pads, said two mechanical pads opposing each other on the substrate, wherein a mechanical interposer comprises a substrate and mechanical pads and does not have an active pad, and wherein said adjacent electronic components are connected serially; and a circuit board comprising traces wherein at least one trace of said traces is an active trace and at least one trace of said traces is a mechanical trace; wherein at least one first external termination of at least one first electronic component of said electronic components is in electrical contact with at least one said active trace; wherein at least one second external termination of at least one second electronic component of said electronic components is in electrical contact with at least one said mechanical trace.

28. The electronic circuit of claim 27 wherein said high density multi-component package is mounted vertically on said circuit board.

29. The electronic circuit of claim 28 further comprising a connector between one at least one said external termination and at least one said active trace.

30. The electronic circuit of claim 29 wherein said connector is selected the group consisting of an electrical connection and a functional connection.

31. The electronic circuit of claim 30 wherein said connector is an additional electronic component.

32. The electronic circuit of claim 31 wherein said additional electronic component is selected from capacitor, resistor, varistor, inductor, diode, fuse, overvoltage discharge device, sensor, switch, electrostatic discharge suppressor, semiconductor and integrated circuit.

33. The electronic circuit of claim 32 wherein said additional electronic component is an MLCC.

34. The electronic circuit of claim 32 wherein said additional electronic component is selected from resistor, inductor and fuse.

35. The electronic circuit of claim 27 wherein said high density multi-component package is mounted horizontally on said circuit board.

36. The electronic circuit of claim 35 wherein at least one said active trace electrically connects adjacent external terminations.

37. The electronic circuit of claim 27 wherein said interposer is an active interposer.

38. The electronic circuit of claim 27 wherein said interposer is a mechanical interposer.

39. The electronic circuit of claim 27 wherein each said electronic component is independently selected from the group consisting of MLCC, resistor, varistor, inductor, diode, fuse, overvoltage discharge device, sensor, switch, electrostatic discharge suppressor, semiconductor and integrated circuit.

40. The electronic circuit of claim 39 wherein at least one of said electronic components is selected from the group consisting of MLCC, resistor, varistor, inductor, diode, fuse, overvoltage discharge device, sensor, switch and electrostatic discharge suppressor.

41. The electronic circuit of claim 39 wherein at least one said electronic component is an MLCC.

42. The electronic circuit of claim 40 wherein at least one said electronic component is a light emitting diode.

43. The electronic circuit of claim 27 wherein all electronic components are serially connected.

44. The electronic circuit of claim 27 further comprising at least two additional electronic components electrically connected in parallel.

45. The electronic circuit of claim 27 further comprising multiple interposers of said interposer selected from an active interposer and a mechanical interposer.

46. The electronic circuit of claim 45 wherein at least one interposer of said multiple interposers is an active interposer.

47. The electronic circuit of claim 45 wherein each interposer of said multiple interposers is a mechanical interposer.

48. The electronic circuit of claim 45 wherein said multiple interposers comprise at least one active interposer and at least one mechanical interposer.

49. The electronic circuit of claim 27 wherein at least one electronic component of said electronic components is directly attached to an adjacent electronic component by an interconnect.

50. The electronic circuit of claim 27 wherein said electronic components form at least one stack.

51. The electronic circuit of claim 50 further comprising a secondary electrical component.

52. The electronic circuit of claim 51 comprising at least two stacks wherein said secondary electrical component spans said stacks.

53. The electronic circuit of claim 51 wherein said secondary electrical component is in electrical parallel with at least two said electronic components.

54. The electronic circuit of claim 27 wherein said adjacent electronic components are attached to said interposer by an interconnect, wherein said interconnect is selected from the group consisting of solder, conductive adhesive, polymer solder and transient liquid phase sintering adhesive.

55. The electronic circuit of claim 54 wherein said interconnect is transient liquid phase sintering adhesive comprising a high melting point metal and a low melting point metal.

56. The electronic circuit of claim 55 wherein said low melting point metal is selected from the group consisting of indium, tin, lead, antimony, bismuth, cadmium, zinc, gallium, tellurium, mercury, thallium, selenium, or polonium.

57. The electronic circuit of claim 55 wherein said high melting point metal is selected from the group consisting of silver, copper, aluminum, gold, platinum, palladium, beryllium, rhodium, nickel, cobalt, iron and molybdenum.

58. The electronic circuit of claim 55 wherein said transient liquid phase sintering adhesive comprises tin and copper or indium and silver.

59. The electronic circuit of claim 27 wherein at least one said external termination comprises a metal selected from the group consisting of silver, tin, gold, copper, platinum, palladium and nickel.

60. The electronic circuit of claim 27 wherein said high density multi-component package is selected from the group consisting of a Pi filter, a T filter and an LC filter.

\* \* \* \* \*